United States Patent
Morikawa et al.

(10) Patent No.: US 6,767,627 B2
(45) Date of Patent: Jul. 27, 2004

(54) HARD FILM, WEAR-RESISTANT OBJECT AND METHOD OF MANUFACTURING WEAR-RESISTANT OBJECT

(75) Inventors: Yasuomi Morikawa, Kobe (JP); Toshiki Sato, Kobe (JP); Hirofumi Fujii, Takasago (JP)

(73) Assignee: Kobe Steel, Ltd., Kobe (JP)

(*) Notice: Subject to any disclaimer, the term of this patent is extended or adjusted under 35 U.S.C. 154(b) by 0 days.

(21) Appl. No.: 10/321,462

(22) Filed: Dec. 18, 2002

(65) Prior Publication Data

US 2004/0121147 A1 Jun. 24, 2004

(51) Int. Cl.⁷ .............................. B32S 7/00; B05D 1/36
(52) U.S. Cl. ................. 428/336; 428/216; 428/657; 428/698; 428/699; 428/701; 428/702; 427/226; 427/372.2; 427/419.1; 427/419.2; 427/532; 427/543
(58) Field of Search ................... 428/336, 697, 428/699, 701, 702, 216, 698; 427/532, 543, 226, 372.2, 419.1, 419.2

(56) References Cited

U.S. PATENT DOCUMENTS

| | | | |
|---|---|---|---|
| 3,963,530 A | * | 6/1976 | Smollett et al. |
| 4,714,660 A | * | 12/1987 | Gates, Jr. |
| 4,749,630 A | * | 6/1988 | Konig et al. |
| 5,071,696 A | * | 12/1991 | Chattfield et al. |
| 5,357,389 A | * | 10/1994 | Blanchette et al. |
| 5,607,781 A | * | 3/1997 | Okuno et al. |
| 5,820,976 A | * | 10/1998 | Kamo |
| 6,599,636 B1 | * | 7/2003 | Alger |
| 6,602,390 B1 | * | 8/2003 | Brandle et al. |

* cited by examiner

Primary Examiner—Archene Turner
(74) Attorney, Agent, or Firm—Oblon, Spivak, McClelland, Maier & Neustadt, P.C.

(57) ABSTRACT

A hard film comprises an oxide film of corundum crystal structure having a lattice constant in the range of 4.779 to 5.000 Å and a thickness not smaller than 0.005 μm, and an alumina film of corundum crystal structure formed on one of surfaces of the oxide film. The oxide film is formed of $Cr_2O_3$, $(Fe, Cr)_2O_3$ or $(Al, Cr)_2O_3$. The alumina film excellent in heat resistance and wear resistance can be formed on a base object under a low-temperature condition that will not deteriorate the characteristics of the base object.

20 Claims, 1 Drawing Sheet

HARD FILM, WEAR-RESISTANT OBJECT AND METHOD OF MANUFACTURING WEAR-RESISTANT OBJECT

BACKGROUND OF THE INVENTION

1. Field of the Invention

The present invention relates to hard films excellent in wear resistance and heat resistance to be applied to wear-resistant objects, such as cutting tools, sliding members, dies and molds. More specifically, the present invention relates to useful hard films excellent in wear resistance and heat resistance capable of being formed at low temperatures on base objects, such as cutting tools, sliding member and the like, without spoiling the characteristics of the base objects.

2. Description of the Related Art

Although the hard films of the present invention are versatile and are applicable to diverse uses as mentioned above, the hard films of the present invention will be described as applied mostly to cutting tools by way of example.

Cutting tools and sliding members required to have excellent wear resistance and sliding characteristics are formed by coating the surfaces of base objects of high-speed tool steels and cemented carbides with hard films of titanium nitride and titanium-aluminum nitrides by a physical vapor deposition process (hereinafter referred to as "PVD process") and chemical vapor deposition process (hereinafter referred to as "CVD process"). Sometimes, the cutting edges of cutting tools are heated at high temperatures exceeding 1000° C. Therefore, hard films of alumina are formed on such cutting tools to ensure the heat resistance of the cutting tools.

Although the crystal structure of alumina is dependent on deposition temperature, alumina except for alumina of corundum crystal structure is metastable. However, the crystal structure of a metastable alumina film formed on the edge of a cutting tool, whose temperature varies in a wide temperature range between an ordinary temperature and 100° C., changes, cracks develop in the alumina film and, sometimes, the alumina film comes off the cutting tool. Only an alumina film of corundum crystal structure once formed by a CVD process that heats a base object at a temperature not lower than 1000° C. maintains thermodynamically stable structure regardless of temperature. Therefore, it is very effective in providing cutting tools with heat resistance to coat the cutting tools with an alumina film of corundum crystal structure.

The alumina film of corundum crystal structure cannot be formed unless the base object is heated at a high temperature not lower than 1000° C. Therefore such an alumina film can be formed on limited base objects because some base objects soften and loose an aptitude for base objects for forming wear-resistant objects when exposed to high temperatures not lower than 1000° C.

A very hard $(Al, Cr)_2O_3$ mixed crystal film formed at temperatures not higher than 500° C. is mentioned in JP5-208326A. However, Cr lying in the surface of the mixed crystal film is liable to react with Fe of a workpiece of a metal containing Fe as a principal component during machining and, consequently, the mixed crystal film wears out rapidly to shorten its life.

A method of forming films of alumina of corundum crystal structure at temperatures not lower than 750° C. by reactive sputtering using a high-power pulse power source of 11 to 17 kW is mentioned in O. Zywitzki, G. Hoetzsch, et al., Surf. Coat. Technol., 86–87 (1996) 640–647. This method of forming films of alumina of corundum crystal structure inevitably needs a large pulse power source and needs to heat a base object at temperatures not lower than 750° C. Consequently, high-speed tool steels generally used for forming base objects of cutting tools are softened and deteriorate the characteristics of the base objects.

Cutting tools prevalently used at present are formed by coating the surfaces of base objects with a wear-resistant film of titanium nitride, titanium carbide or carbonitride, and forms a film of alumina of corundum crystal structure over the wear-resistant film. Recently, films of titanium nitride, titanium carbide and carbonitride have been gradually replaced by films of titanium-aluminum mixed nitride (hereinafter referred to as "TiAlN") having excellent wear-resistant property, and TiAlN films have been applied to cutting tools and such.

However, whereas the TiAlN film can be formed only by an arc ion plating process (hereinafter referred to as "AIP process"), i.e., one category of PVD processes, the alumina film of corundum crystal structure can be formed only by a CVD process. Therefore, to obtain a laminated film of an alumina film and a TiAlN film, the alumina film and the TiAlN film need to be formed successively by using a CVD system and a PVD system, respectively. Consequently, the production efficiency of the processes is very low. Thus, it has been desired to establish techniques capable of efficiently, continuously forming an alumina film of corundum crystal structure, a TiAlN film and other useful films.

SUMMARY OF THE INVENTION

The present invention has been made in view of the foregoing circumstances and it is therefore an object of the present invention to provide a hard film having excellent heat resistance and wear resistance and capable of efficiently formed on a base object at a low temperature that will not deteriorate the characteristics of the base object.

According to a first aspect of the present invention, a hard film comprising an oxide film of corundum crystal structure having a lattice constant in the range of 4.779 to 5.000 Å and a thickness of 0.005 μm or above; and an alumina film of corundum crystal structure formed on one surface of the oxide film of corundum crystal structure.

Desirably, the oxide film is a film of $Cr_2O_3$, $(Fe, Cr)_2O_3$ or $(Al, Cr)_2O_3$, $(Fe, Cr)_2O_3$ is $(Fe_x, Cr_{(1-x)})_2O_3$, where $0 \leq x \leq 0.54$, $(Al, Cr)_2O_3$ is $(Al_y, Cr_{(1-y)})_2O_3$, where $0 \leq y \leq 0.90$.

Preferably, a film of a mixed nitride of one or some of Ti, Cr and V, and Al is formed directly on the other surface of the oxide film of corundum crystal structure or on an intermediate layer formed on the other surface of the oxide film of corundum crystal structure, and the intermediate layer is a film of $(Al_z, Cr_{(1-z)})N$, where $0 \leq z \leq 0.90$.

The present invention includes a wear-resistant object formed by coating a base object with any one of the foregoing hard films with the alumina film of corundum crystal structure facing out.

A method of forming a wear-resistant object, in a second aspect of the present invention comprises the steps of forming an alumina film of corundum crystal structure, forming the oxide film, forming the mixed nitride film and, if necessary, forming an intermediate layer by PVD processes. Preferably, the film of $(Al_y, Cr_{(1-y)})_2O_3$, where $0 \leq y \leq 0.90$ is formed by forming the intermediate layer of $(Al_z, Cr_{(1-z)})N$, where $0 \leq z \leq 0.90$, and converting a surface part of the intermediate layer into an oxide layer by an oxidation process that holds the base object at a temperature not lower than 450° C. in an oxygen atmosphere. Preferably, the base object is heated at temperatures not lower than 300° C. to form the aluminum film of corundum crystal structure.

The oxide film of corundum crystal structure having the lattice constant specified by the present invention formed before the formation of the alumina film of corundum crystal structure enables the formation of the alumina film of corundum crystal structure excellent in heat resistance and wear resistance. The hard film forming method of forming the foregoing hard film is capable of forming the alumina film of corundum crystal structure on diverse base objects to provide the base object with excellent heat resistance and wear resistance.

DESCRIPTION OF THE PREFERRED EMBODIMENTS

Figure 1:
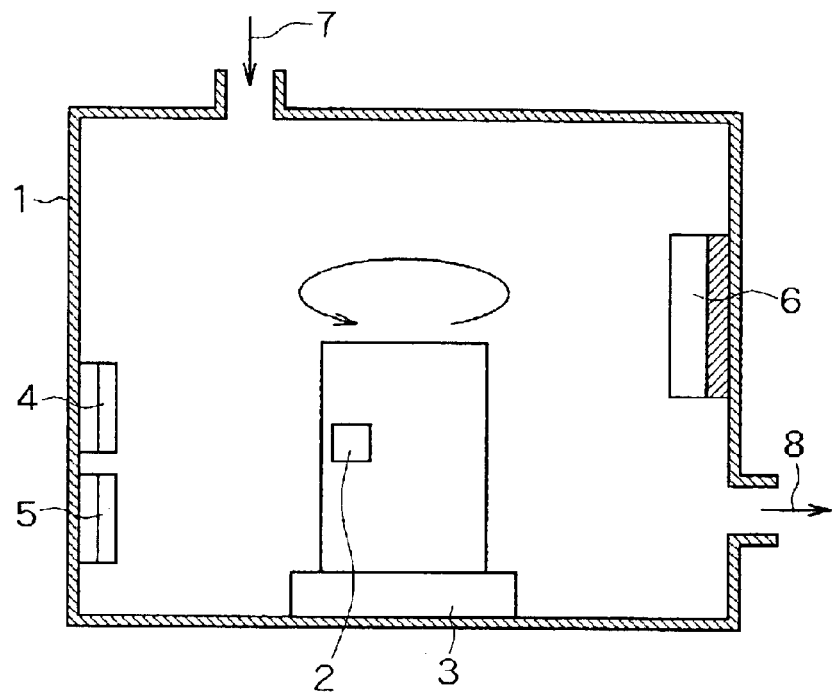
FIG. 1 is a schematic sectional view of a PVD system for forming a hard film according to the present invention.

The inventors of the present invention made earnest studies to develop a method capable of forming an alumina film of corundum crystal structure at a low temperature without deteriorating the characteristics of a base object to be coated with a hard film and have found that an alumina film of corundum crystal structure can be easily formed even under a low-temperature condition on an oxide film of the same corundum crystal structure as the crystal structure of alumina and having a specific lattice constant. The oxide film, which is an important feature of the present invention, and other useful films having excellent characteristics will be described hereinafter.

Oxide Film

Substances having the same corundum crystal structure as that of alumina and lattice constants nearly equal to that of alumina include $Cr_2O_3$, $Fe_2O_3$, $(Fe, Cr)_2O_3$ and $(Cr, Al)_2O_3$. Alumina films were formed on oxide films of those substances, respectively. It was found that an alumina film of corundum crystal structure can be formed under a low-temperature condition of temperatures, for example, in the range of 300 to 700° C. when the oxides forming the oxide films have a lattice constant in the range of 4.779 to 5.000 Å, whereas alumina films of corundum crystal structure cannot be formed when the lattice constants of the oxide films of corundum crystal structure are outside the aforesaid range.

Since the difference between the lattice constant exceeding 5.000 Å of the oxide film and that of the alumina film formed on the oxide film is excessively large, the alumina film of corundum crystal structure cannot be easily formed and an alumina film of crystal structure other than corundum crystal structure, such as cubic crystal structure, is formed. Therefore, the lattice constant of the oxide film must be not greater than 5.000 Å, preferably, not greater than 4.982 Å.

When a mixed oxide of Fe and Cr is used for forming an oxide film, the lattice constant of the mixed oxide exceeds 5.000 Å and an alumina film of corundum crystal structure cannot be formed on the oxide film if the Fe composition ratio exceeds 0.54. Thus, a mixed oxide of Fe and Cr expressed by composition formula: $(Fe_xCr_{(1-x)})_2O_3$ must meet an inequality: $0 \leq x \leq 0.54$, preferably, $0 \leq x \leq 0.30$.

The significance of the lower limit of 4.779 Å of the lattice constant of the oxide film will be described.

The respective lattice constants of $Cr_2O_3$ and $Fe_2O_3$ are greater than that of $Al_2O_3$. Therefore, oxide films having a small lattice constant nearly equal to that of $Al_2O_3$ can be formed of a mixed oxide of Cr and Al or a mixed oxide of Fe and Al. However, mixed oxides of Fe and Al have spinel structure and are unable to form an oxide film of pure corundum crystal structure. Thus, mixed oxides of Fe and Al are unsuitable for forming oxide films conforming to the present invention.

Mixed oxides of Cr and Al having a greater Al composition ratio have a smaller lattice constant. When the Al composition ratio exceeds 0.90, an oxide film of corundum crystal structure can be formed only at high temperatures; oxide films of crystal structure other than corundum crystal structure are formed and oxide films consisted of only corundum crystal structure cannot be formed at low temperatures. Therefore, the lower limit of the lattice constant of the oxide film is equal to the lattice constant of 4.779 Å of $(Al_{0.9}Cr_{0.1})_2O_3$. When the oxide film is formed of a mixed oxide of Cr and Al expressed by $(Al_y, Cr_{(1-y)})_2O_3$, it is preferable that the mixed oxide meets $0 \leq y \leq 0.90$.

According to the present invention, the thickness of the oxide film must be 0.005 μm or above because an oxide film of a thickness below 0.005 μm is not sufficiently dense and it is difficult to form an alumina film of pure corundum crystal structure. Preferably, the thickness of the oxide film is 0.01 μm or above, more preferably, 0.02 μm or above. If the oxide film is excessively thick, cracks are liable to develop in the hard film and the hard film is liable to come off during machining. Therefore, it is preferable that the thickness of the oxide film is 1.0 μm or below, more preferably, 5 μm or below, most preferably, 3 μm or below.

Mixed Nitride Film

According to the present invention, it is desirable that the oxide film is formed on a film of a mixed nitride of one or some of Ti, Cr and V, and Al to further enhance the wear resistance of cutting tools and the like.

The mixed nitride film is unable to exercise the aforesaid effect if the thickness thereof is excessively small. Preferably, the thickness of the nitride film is 0.5 μm or above, more preferably, 1 μm or above. If the mixed nitride film is excessively thick, cracks are liable to develop during machining. Therefore, it is preferable that the thickness of the mixed nitride film is 20 μm or below, more preferably, 10 μm or below.

Intermediate Layer

It is effective in enhancing the adhesion of the oxide film to the base object to interpose an intermediate layer of an Al—Cr nitride expressed by $(Al_zCr_{(1-z)})N$ between the base object and the oxide film. When a surface layer of an intermediate layer is oxidized to form an Al—Cr mixed oxide layer of corundum crystal structure of an Al—Cr mixed oxide expressed by $(Al_yCr_{(1-y)})_2O_3$, where $0 \leq y \leq 0.90$, it is preferable that the Al—Cr mixed nitride expressed by $(Al_zCr_{(1-z)})N$ meets an inequality: $0 \leq z \leq 0.90$, more preferably, $0 \leq z \leq 0.75$.

Alumina Film

Preferably, the thickness of the alumina film of corundum crystal structure is in the range of 0.1 to 20 μm. When an alumina film of a thickness less than 0.1 μm is formed on a cutting tool, the alumina film wears away rapidly and is unable to exercise effects of alumina, such as a heat-resisting effect. Preferably, the thickness of the alumina film is 0.5 μm or above, more preferably, 1 μm or above. Cracks are liable to develop due to stress induced in the alumina film if the thickness is greater than 20 μm. Preferably, the thickness of the alumina film is 10 μm or below, more preferably, 5 μm or below.

Film Forming Method

The hard film of the present invention can be formed by the following method. A PVD system capable of carrying out an AIP process and an unbalanced magnetron sputtering process (hereinafter referred to as "UBMS process") in combination is used. A Ti—Al alloy target is used as an AIP solid target. A Cr target and an Al target are used as UBMS solid sputtering targets. A TiAlN film, a chromium oxide film, i.e., an oxide film, and an alumina film of corundum crystal structure can be formed in that order on the surface of a base object by a series of film-forming processes in which evaporation sources are operated successively.

When a Cr—Fe alloy target or a Cr—Al alloy target is used as a sputtering target instead of the Cr target, a Cr—Fe mixed oxide film or a Cr—Al mixed oxide film can be formed as the oxide film.

The intermediate layer can be formed after forming the mixed nitride film by a PVD process, such as an AIP process or an UBMS process that makes an Al—Cr alloy target evaporate in a nitrogen atmosphere.

When an oxide film of $(Al_y Cr_{(1-y)})_2 O_3$, where $0 \leq y \leq 0.9$, is formed on an intermediate layer of $(Al_z Cr_{(1-z)})N$, where $0 \leq z \leq 0.90$, the base object is heated at a temperature not lower than 450° C. in an oxygen atmosphere to oxidize a surface layer of the intermediate layer. Thus, the $(Al, Cr)_2 O_3$ can be easily formed in the surface layer of the intermediate layer. Preferably, the base object is heated at a temperature not lower than 490° C. If the base object is formed of a high-speed tool steel, the hardness of the base object decreases if the base object is heated at an excessively high temperature. Therefore, it is preferable that the temperature of the base object for oxidation is 500° C. or below.

The present invention forms the oxide film before hand and heats the base object at a temperature preferably 300° C. or above to form an alumina film of corundum crystal structure on the oxide film. Preferably, the base object is heated at a temperature of 400° C. or above, more preferably, 450° C. or above. If the base object of a high-speed tool steel is heated at an excessively high temperature, the hardness of the base object decreases and the characteristics of the base object is deteriorated. Therefore, it is preferable to form the alumina film while the base object is heated at a temperature not higher than 500° C.

The AIP process and the UBMS process for forming those films including the oxide film are examples of a PVD process. Those films may be formed by any prevalently used PVD processes other than the AIP process and the UBMS process.

EXAMPLES

The present invention will be described in detail in terms of examples thereof, which is not intended to limit the scope of the present invention.

(1) Hard films were formed on base objects by the following processes. Alumina films of corundum crystal structure were formed by heating the base objects at temperatures shown in Tables 1 and 2.

1) Experiments Nos. 1 to 29 and Nos. 31 to 44 were conducted by using a PVD system shown in FIG. 1 for forming hard films. A Ti—Al alloy target 6 for AIP, and a Cr target 4 and an Al target 5 for UBMS were set in a processing chamber defined by a vessel 1. A base object 2, i.e., a cutting insert of a cemented carbide(SNGN120408) or a high-speed tool steel, was set on a sample support table 3. The processing chamber of the vessel 1 was evacuated through an outlet port 8 to a vacuum. Different films were deposited by supplying gases for forming the different films through an inlet port 7 into the vessel 1.

Nitrogen gas was supplied into the vessel 1 to create a nitrogen atmosphere in the vessel 1 and the Ti—Al alloy target 6 was used to form a 3 µm thick hard film of TiAlN by an AIP process. Subsequently, a chromium oxide film was formed by a UBMS process in an Ar—$O_2$-mixed atmosphere by using the Cr target 4. Then, an alumina film was formed by a UBMS process in an Ar—$O_2$-mixed atmosphere by using the Al target 5.

An Al—Cr alloy target and a Fe—Cr alloy target were used instead of the Cr target 4 to form an $(Al, Cr)_2 O_3$ film and a $(Fe, Cr)_2 O_3$ film, respectively.

Experiments Nos. 33, 34 and 39 formed an oxide film directly on the surface of a base object without forming any mixed nitride film, such as a hard film of TiAlN.

Figure 2:
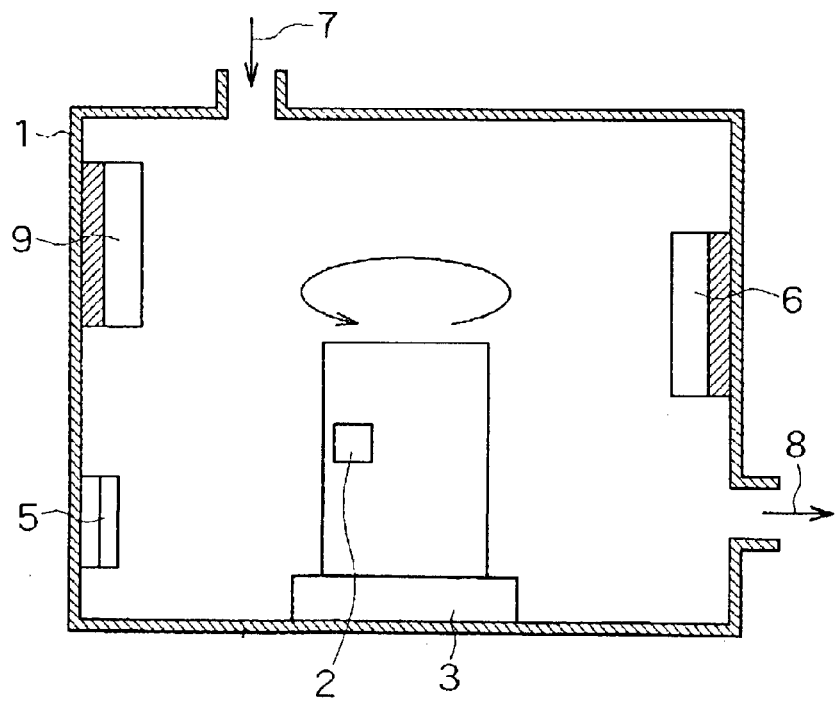
FIG. 2 is a schematic sectional view of another PVD system for forming a hard film according to the present invention.

2) Experiments Nos. 30, 45, 46, 48 and 49 were conducted by using a PVD system shown in FIG. 2 for forming hard films. A Ti—Al alloy target 6 and a Cr—Al alloy target 9 for AIP, and an Al target 5 for UBMS were set in a processing chamber defined by a vessel 1. A base object 2, i.e., a cutting insert of a cemented carbide(SNGN120408) or a high-speed tool steel, was set on a sample support table 3. The processing chamber of the vessel 1 was evacuated through an outlet port 8 to a vacuum. Different films were deposited by supplying gases for forming the different films through an inlet port 7 into the vessel 1.

Nitrogen gas was supplied into the vessel 1 to create a nitrogen atmosphere in the vessel 1 and the Ti—Al alloy target 6 was used to form a 3 µm thick hard film of TiAlN by an AIP process. Subsequently, a chromium-aluminum nitride film was formed by an AIP process in a nitrogen atmosphere by using the Cr—Al alloy target 9. Then, the base object provided with those films was held in the vessel 1, and the Cr—Al nitride film was oxidized in an oxygen atmosphere at 450° C. to form an oxide film of Al—Cr mixed oxide. Then, an alumina film was formed by a UBMS process in an Ar—$O_2$-mixed atmosphere by using the Al target 5. The thickness of the Cr—Al nitride film was 0.5 µm.

Experiment No. 47 placed an Fe—Cr alloy target additionally in the chamber 1 of the PVD system shown in FIG. 2, formed a hard film of TiAlN and a film of Cr—Al nitride by the aforesaid processes, formed an Fe—Cr mixed oxide film by a UBMS process in an Ar—O mixed atmosphere, and then an alumina film was formed by the aforesaid process on the Fe—Cr mixed oxide film.

The types of crystal structure of the alumina films thus formed, and the lattice constants of the oxide films were examined and measured by a thin-film X-ray diffractometer or a transmission electron, beam microscope. The thicknesses of the alumina films and the oxide films were measured by a scanning electron microscope or a transmission electron beam microscope. Components of the films were measured through depth analysis by X-ray photoelectron spectroscopy. Measured results are shown in Tables 1 and 2.

TABLE 1

| Experiment No. | Quality of base object | Mixed nitride film | Intermediate layer | Oxide film Quality | Composition (at. %) | Lattice constant (Å) | Thickness (μm) | Alumina film Crystal structure* | Thickness (μm) | Process temperature (° C.) |
|---|---|---|---|---|---|---|---|---|---|---|
| 1 | Cemented carbide | TiAlN | — | $Cr_2O_3$ | — | 4.959 | 0.005 | α | 0.15 | 400 |
| 2 | Cemented carbide | TiAlN | — | $Cr_2O_3$ | — | 4.959 | 0.01 | α | 1.5 | 300 |
| 3 | Cemented carbide | TiAlN | — | $Cr_2O_3$ | — | 4.959 | 0.01 | α | 1.5 | 420 |
| 4 | Cemented carbide | TiAlN | — | $Cr_2O_3$ | — | 4.959 | 0.01 | α | 1.5 | 500 |
| 5 | Cemented carbide | TiAlN | — | $Cr_2O_3$ | — | 4.959 | 0.03 | α | 0.2 | 600 |
| 6 | Cemented carbide | TiAlN | — | $Cr_2O_3$ | — | 4.959 | 0.03 | α | 0.8 | 600 |
| 7 | Cemented carbide | TiAlN | — | $Cr_2O_3$ | — | 4.959 | 0.03 | α | 1.5 | 600 |
| 8 | Cemented carbide | TiAlN | — | $Cr_2O_3$ | — | 4.959 | 0.03 | α | 6 | 600 |
| 9 | Cemented carbide | TiAlN | — | $Cr_2O_3$ | — | 4.959 | 0.03 | α | 11 | 600 |
| 10 | Cemented carbide | TiAlN | — | $Cr_2O_3$ | — | 4.959 | 0.03 | α | 19 | 600 |
| 11 | Cemented carbide | TiAlN | — | $Cr_2O_3$ | — | 4.959 | 1 | α | 2 | 550 |
| 12 | Cemented carbide | TiAlN | — | $Cr_2O_3$ | — | 4.959 | 4 | α | 4 | 700 |
| 13 | Cemented carbide | TiAlN | — | $Cr_2O_3$ | — | 4.959 | 9 | α | 3 | 650 |
| 14 | Cemented carbide | TiAlN | — | $Cr_2O_3$ | — | 4.959 | 0.003 | α + γ | 1 | 500 |
| 15 | Cemented carbide | TiAlN | — | $Cr_2O_3$ | — | 4.959 | 11 | α | 2 | 450 |
| 16 | Cemented carbide | TiAlN | — | $Cr_2O_3$ | — | 4.959 | 0.1 | α | 22 | 580 |
| 17 | Cemented carbide | TiAlN | — | $Cr_2O_3$ | — | 4.959 | 0.05 | α | 0.08 | 630 |
| 18 | Cemented carbide | TiAlN | — | $(Fe, Cr)_2O_3$ | Fe:54,Cr:46 | 5.000 | 0.03 | α | 0.2 | 300 |
| 19 | Cemented carbide | TiAlN | — | $(Fe, Cr)_2O_3$ | Fe:40,Cr:60 | 4.990 | 0.03 | α | 0.8 | 750 |
| 20 | Cemented carbide | TiAlN | — | $(Fe, Cr)_2O_3$ | Fe:20,Cr:80 | 4.974 | 0.03 | α | 1.5 | 650 |
| 21 | Cemented carbide | TiAlN | — | $(Fe, Cr)_2O_3$ | Fe:58,Cr:42 | 5.003 | 0.03 | α + γ | 2 | 700 |
| 22 | Cemented carbide | TiAlN | — | $Fe_2O_3$ | — | 5.036 | 0.1 | α + γ | 1 | 650 |
| 23 | Cemented carbide | TiAlN | — | $(Fe, Cr)_2O_3$ | Fe:40,Cr:60 | 4.990 | 11 | α | 1 | 550 |
| 24 | Cemented carbide | TiAlN | — | $(Fe, Cr)_2O_3$ | Fe:40,Cr:60 | 4.990 | 0.003 | α + γ | 3 | 750 |

*: α indicates corundum crystal structure, and γ indicates cubic crystal structure

TABLE 2

| Experiment No. | Quality of base object | Mixed nitride film | Intermediate layer | Oxide film Quality | Composition (at. %) | Lattice constant (Å) | Thickness (μm) | Alumina film Crystal structure* | Thickness (μm) | Process temperature (° C.) |
|---|---|---|---|---|---|---|---|---|---|---|
| 25 | Cemented carbide | TiAlN | — | $(Cr, Al)_2O_3$ | Cr:10, Al:90 | 4.779 | 0.1 | α | 0.8 | 600 |
| 26 | Cemented carbide | TiAlN | — | $(Cr, Al)_2O_3$ | Cr:50, Al:50 | 4.859 | 0.1 | α | 1.5 | 550 |
| 27 | Cemented carbide | TiAlN | — | $(Cr, Al)_2O_3$ | Cr:80, Al:20 | 4.919 | 0.1 | α | 6 | 400 |
| 28 | Cemented carbide | TiAlN | — | $(Cr, Al)_2O_3$ | Cr:5, Al:95 | 4.769 | 0.03 | α + γ | 1 | 600 |
| 29 | Cemented carbide | TiAlN | — | $(Cr, Al)_2O_3$ | Cr:50, Al:50 | 4.859 | 0.1 | amo. | 1 | 200 |
| 30 | Cemented carbide | TiAlN | (Cr, Al)N | $(Cr, Al)_3O_3$ | Cr:50, Al:50 | 4.859 | 0.1 | α | 1.5 | 550 |
| 31 | High-speed tool steel | TiAlN | — | $Cr_2O_3$ | — | 4.959 | 0.005 | α | 2 | 300 |
| 32 | High-speed tool steel | TiAlN | — | $Cr3O_3$ | — | 4.959 | 0.01 | α | 2 | 400 |
| 33 | High-speed tool steel | — | — | $Cr_2O_3$ | — | 4.959 | 0.1 | α | 2 | 450 |
| 34 | High-speed tool steel | — | — | $Cr_2O_3$ | — | 4.959 | 1 | α | 2 | 300 |
| 35 | High-speed tool steel | TiAlN | — | $Cr_2O_3$ | — | 4.959 | 0.003 | α + γ | 2 | 450 |
| 36 | High-speed tool steel | TiAlN | — | $Cr_2O_3$ | — | 4.959 | 0.1 | α + γ | 2 | 290 |
| 37 | High-speed tool steel | TiAlN | — | $(Fe, Cr)_2O_3$ | Fe:54, Cr:46 | 5.000 | 1 | α | 2 | 300 |
| 38 | High-speed tool steel | TiAlN | — | $(Fe, Cr)_2O_3$ | Fe:40, Cr:60 | 4.990 | 1 | α | 2 | 450 |
| 39 | High-speed tool steel | — | — | $(Fe, Cr)_3O_3$ | Fe:20, Cr:80 | 4.974 | 1 | α | 2 | 400 |
| 40 | High-speed tool steel | TiAlN | — | $(Fe, Cr)_2O_3$ | Fe:58, Cr:42 | 5.003 | 1 | α + γ | 2 | 450 |
| 41 | High-speed tool steel | TiAlN | — | $(Cr, A)_2O_3$ | Cr:10, Al:90 | 4.779 | 0.005 | α | 2 | 300 |
| 42 | High-speed tool steel | TiAlN | — | $(Cr, A)_2O_3$ | Cr:50, Al:50 | 4.859 | 0.1 | α | 2 | 450 |
| 43 | High-speed tool steel | TIAlN | — | $(Cr, A)_2O_3$ | Cr:80, Al:20 | 4.919 | 0.1 | α | 2 | 400 |
| 44 | High-speed tool steel | TiAlN | — | $(Cr, A)_2O_3$ | Cr:5, Al:95 | 4.769 | 0.1 | α + γ | 2 | 450 |
| 45 | High-speed tool steel | TiAlN | (Cr, Al)N | $(Cr, A)_2O_3$ | Cr:50, Al:50 | 4.859 | 0.005 | α | 2 | 400 |
| 46 | High-speed tool steel | TiAlN | (Cr, Al)N | $(Cr, A)_2O_3$ | Cr:80, Al:20 | 4.919 | 1 | α | 2 | 450 |
| 47 | High-speed tool steel | TiAlN | (Cr, Al)N | $(Fe, Cr)_2O_3$ | Fe:40, Cr:60 | 4.990 | 0.1 | α | 2 | 350 |
| 48 | High-speed tool steel | TiAlN | (Cr, Al)N | $(Cr, A)_2O_3$ | Cr:50, Al:50 | 4.859 | 0.003 | α + γ | 2 | 450 |
| 49 | High-speed tool steel | TiAlN | (Cr, Al)N | $(Cr, A)_2O_3$ | Cr:80, Al:20 | 4.919 | 1 | α + γ | 2 | 280 |

*: α indicates corundum crystal structure, γ indicates cubic crystal structure, and amo. indicates amorphous structure.

As obvious from Tables 1 and 2, Experiments Nos. 1 to 13, 15 to 20, 23, 25 to 27, 30 to 34, 37 to 39, 41 to 43 and 45 to 47 meeting requirements for the present invention could form alumina films of pure corundum crystal structure.

Experiments Nos. 14, 21, 22, 24, 28, 29, 35, 36, 40, 44, 48 and 49 could not form alumina films of pure corundum crystal structure. The respective lattice constants of the oxide films formed by Experiments Nos. 21, 22, 28, 40 and 44 were outside the range of lattice constant specified by the present invention, and the respective thicknesses of the oxide films formed by Experiments Nos. 14, 24, 35 and 48 were excessively small. Consequently, the alumina films formed by those experiments had types of crystal structure other than the corundum crystal structure, such as cubic crystal structure, in addition to corundum crystal structure.

The alumina films formed on the excessively thin oxide films formed by Experiments Nos. 14, 24, 35 and 48 had mixed crystal structure of corundum crystal structure and cubic crystal structure. It was found through the observation of the samples formed by Experiments Nos. 14, 24, 35 and 48 by a transmission electron beam microscope that the base objects were not covered satisfactorily with the oxide films, the surfaces of the base objects were partly exposed, and alumina films of cubic crystal structure were formed on exposed parts of the base objects.

It was inferred that Experiments Nos. 29, 36 and 49 formed the alumina films of crystal structure other than corundum crystal structure because those experiments formed the alumina films at temperatures lower than those recommended by the present invention.

(2) steel rods (S50C, JIS) were turned with cutting inserts formed by Experiments Nos. 5 to 10, 14 and 29, and the depth of craters in cutting inserts formed by turning were measured by a surface roughness tester. Measured results are shown in Table 3.

Quality of test rods: S50C (JIS)
Cutting speed: 200 mm/min
Feed speed: 0.2 mm/sec
Depth of cut: 2 mm
Dry cutting (Air-blowing was used)
Cutting time: 10 min

TABLE 3

| Experiment No. | Crystal structure of the alumina film* | Depth of craters ($\mu$m) |
| --- | --- | --- |
| 5 | α | 14 |
| 6 | α | 9 |
| 7 | α | 7 |
| 8 | α | 11 |
| 9 | α | 15 |
| 10 | α | 14 |
| 14 | α + γ | 125 |
| 29 | amo. | 128 |

*: α indicates corundum crystal structure, γ indicates cubic crystal structure, and amo indicates amorphous structure.

As obvious from Table 3, depths of craters in the cutting inserts formed by Experiments Nos. 5 to 10 having the alumina films of corundum crystal structure were small, which proved the excellent wear resistance of the cutting inserts. Depths of craters in the cutting inserts formed by Experiments Nos. 14 and 29 having the alumina films of crystal structure other than corundum crystal structure were great, which proved the poor wear resistance of the cutting inserts.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A hard film comprising:
   an oxide film of corundum crystal structure having a lattice constant in the range of 4.779 to 5.000 Å and a thickness not smaller than 0.005 $\mu$m; and
   an alumina film of corundum crystal structure formed on one of the surfaces of the oxide film.

2. The hard film according to claim 1, wherein said oxide film comprises $Cr_2O_3$, $(Fe,Cr)_2O_3$ or $(Al,Cr)_2O_3$.

3. The hard film according to claim 2, wherein
   said oxide film comprises said $(Fe,Cr)_2O_3$; and
   said $(Fe,Cr)_2O_3$ is $(Fe_xCr_{1-x})_2O_3$, where $0<x\leq0.54$.

4. The hard film according to claim 2, wherein
   said oxide film comprises said $(Al,Cr)_2O_3$; and
   said $(Al,Cr)_2O_3$ is $(Al_yCr_{1-y})_2O_3$, where $0<y\leq0.90$.

5. The hard film according to claim 1, wherein the thickness of said oxide film is in the range of 0.005 to 10 $\mu$m.

6. The hard film according to claim 5, wherein the thickness of said oxide film is in the range of 0.01 to 5 $\mu$m.

7. The hard film according to claim 6, wherein the thickness of said oxide film is in the range of 0.02 to 3 $\mu$m.

8. The hard film according to claim 1, wherein the thickness of said alumina film is in the range of 0.1 to 20 $\mu$m.

9. The hard film according to claim 8, wherein the thickness of said alumina film is in the range of 0.5 to 10 $\mu$m.

10. The hard film according to claim 9, wherein the thickness of said alumina film is in the range of 1 to 5 $\mu$m.

11. The hard film according to claim 1, further comprising
    a mixed nitride film on the other surface of said oxide film, wherein
    said mixed nitride film consists of N, Al, and at least one of Ti, Cr and V.

12. The hard film according to claim 1, further comprising:
    an intermediate layer on the other surface of said oxide film; and
    a mixed nitride film on the surface of said intermediate layer facing away from said oxide layer, wherein
    said mixed nitride film comprises N, Al, and at least one of Ti, Cr and V.

13. The hard film according to claim 11, wherein said mixed nitride film has a thickness in the range of 0.5 to 20 $\mu$m.

14. The hard film according to claim 12, wherein said intermediate layer comprises $(Al_zCr_{1-z})N$, where $0\leq z\leq0.90$.

15. A wear-resistant object comprising:
    a base object;
    an oxide film of corundum crystal structure formed on said base object, said oxide film having a lattice constant in the range of 4.779 to 5.000 Å and a thickness not smaller than 0.005 $\mu$m; and
    an alumina film of corundum crystal structure formed on said oxide film.

16. A wear-resistant object comprising:
    a base object;
    a mixed nitride film formed on said base object and comprising N, Al, and at least one of Ti, Cr and V;
    an oxide film of corundum crystal structure formed on said mixed nitride film, and having a lattice constant in the range of 4.779 to 5.000 Å and a thickness not smaller than 0.005 $\mu$m; and
    an alumina film of corundum crystal structure formed on said oxide film.

17. A method of fabricating the wear-resistant object stated in claim 15, comprising physical vapor deposition processes for forming said alumina film and said oxide film.

18. A method of fabricating the wear-resistant object stated in claim 16, comprising the successive steps of forming said mixed nitride, and oxidizing the mixed nitride film to form said oxide film.

19. A method of fabricating the wear-resistant object stated in claim 15, comprising the step of forming said alumina film, wherein said base object is heated at 300° C. or above.

20. The method according to claim 18, wherein said mixed nitride film is oxidized in an oxygen atmosphere by heating the base object at 450° C. or above.

* * * * *

UNITED STATES PATENT AND TRADEMARK OFFICE
CERTIFICATE OF CORRECTION

PATENT NO. : 6,767,627 B2
DATED : July 27, 2004
INVENTOR(S) : Morikawa et al.

It is certified that error appears in the above-identified patent and that said Letters Patent is hereby corrected as shown below:

Title page,
Item [73], Assignee, should read:

-- [73] Assignee: Kabushiki Kaisha Kobe Seiko Sho (Kobe Steel, Ltd.), Kobe (JP) --

Signed and Sealed this

Fourteenth Day of December, 2004

JON W. DUDAS
*Director of the United States Patent and Trademark Office*